United States Patent
Mansfield

[11] Patent Number: 5,321,360
[45] Date of Patent: Jun. 14, 1994

[54] RESONANT CAVITIES FOR NMR

[75] Inventor: Peter Mansfield, Nottingham, England

[73] Assignee: British Technology Group Limited, London, England

[21] Appl. No.: 828,942

[22] Filed: Mar. 6, 1992

[51] Int. Cl.$^5$ .............................................. G01R 33/20
[52] U.S. Cl. ...................................................... 324/322
[58] Field of Search ............... 324/300, 307, 309, 318, 324/322, 316; 128/653.5

[56] References Cited

U.S. PATENT DOCUMENTS

| | | | |
|---|---|---|---|
| 4,602,234 | 7/1986 | Buston | 324/320 |
| 4,686,473 | 8/1987 | Chesneau et al. | 324/320 |
| 4,737,718 | 4/1988 | Kemmer et al. | 324/322 |
| 4,820,987 | 4/1989 | Mens | 324/318 |
| 4,825,163 | 4/1989 | Yabusaki et al. | 324/318 |
| 4,845,431 | 7/1989 | Sullenberger | 324/318 |

FOREIGN PATENT DOCUMENTS

| | | |
|---|---|---|
| 2206057 | 12/1986 | European Pat. Off. |
| 2151792 | 7/1985 | United Kingdom |
| 2154749 | 6/1990 | United Kingdom |

Primary Examiner—Michael J. Tokar
Attorney, Agent, or Firm—Cushman, Darby & Cushman

[57] ABSTRACT

A resonant array for NMR for use at high frequencies, the array comprising two identical end structures and a plurality of continuous rods joining the identical end structures to comprise a plurality of or electrical circuit sections, the continuous rods being of electrically conductive material; the continuous rods thereby supporting the end structures a predetermined distance apart.

12 Claims, 13 Drawing Sheets

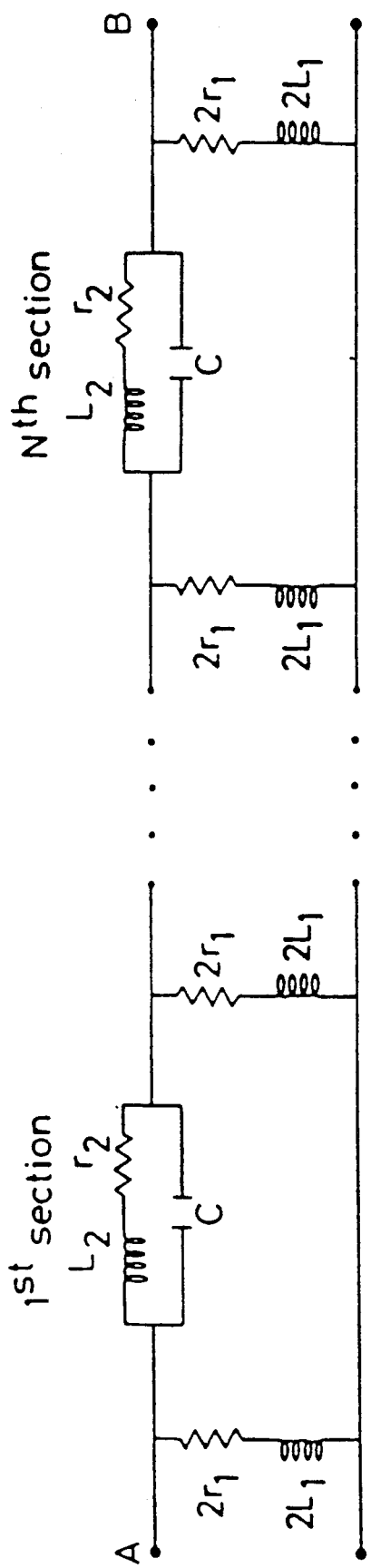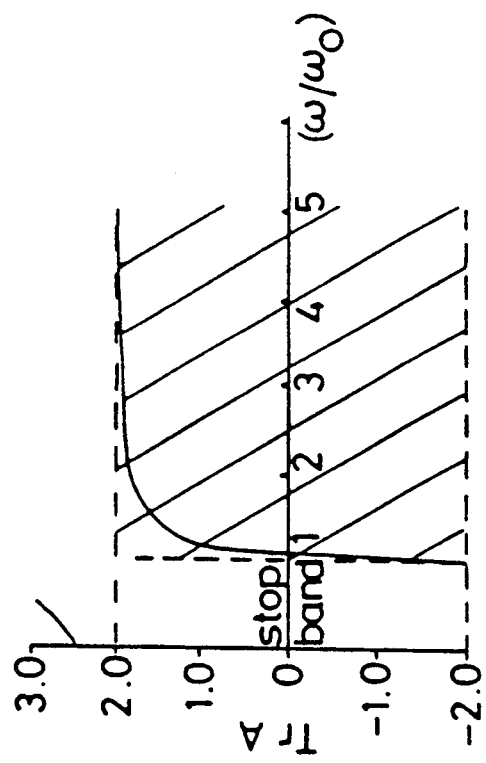
Fig. 6a
Fig. 6b

RESONANT CAVITIES FOR NMR

The present invention relates to resonant cavities for NMR and more particularly to resonant arrays for receiver and transmitter probes for use at high frequencies.

Resonator arrays [Hayes, C., Edelstein, W., Schenk, I., Muller, O. and Eash, M., J. Mag Res. 63, 622-628, (1985)] are becoming increasingly popular for receiver and transmitter coil probes in nuclear magnetic resonance imaging and spectroscopy. More so since ever higher magnetic fields and therefore frequencies are being employed. The difficulty in tuning standard multi-turn saddle coils and short solenoids makes alternative slow wave structures and resonator arrays more attractive. We have considered several structures which employ the resonator array principle, for example the petal resonator [Mansfield, P., J. Phys. D., 21, 1643-4 (1988)]. In considering these devices it is necessary to develop the general theory of lumped parameter circuits as applied to these systems. We have considered the theory from a general matrix approach (Fisher, E. M. 1955 Electronic Engineering 27, 198-204, Sander K. F. and Reed G. A. L 1978 Transmission and Propagation of Electromagnetic Waves, C.U.P. Cambridge). A perturbation approach for the analysis of non-symmetric 'bird cage' resonators has recently been published [Tropp, J., J. Mag. Res. 82, 52-62 (1989)]. The present invention provides a resonant array for NMR for use at high frequencies characterised in that the array comprises two end identical structures and a plurality of continuous rods joining the identical end structures to comprise a plurality of $\pi$ or T electrical circuit sections, the continuous rods being of electrically conductive material; the continuous rods thereby supporting the end structures a predetermined distance apart the end structures being so shaped and dimensioned as to substantially contribute to the electrical characteristics of the array as a whole and to enable it to support a standing wave.

The present invention also provides a modified resonant array in which a first and second rod are combined in a flat rectangular sheet and in which a third and fourth rod are combined in an electrically conductive wire surrounding the sheet.

Embodiments of the present invention will now be described by way of example with reference to the accompanying drawings in which:

FIG. 6a shows an equivalent circuit of the resonant cavity structure, points A and B being joined;

FIG. 6b shows a plot of frequency characteristics for one section of the cavity resonator of FIG. 6a;

FIG. 15b shows the equivalent circuit for the resonator of FIG. 15a;

THEORY

Figure 1A:
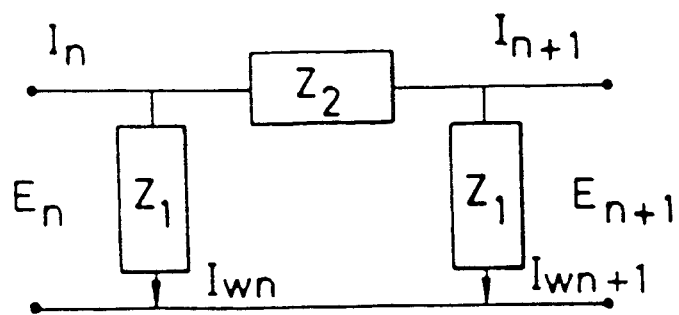
FIG. 1a and FIG. 1b shows sections of a lumped parameter transmission line as FIG. 1(a) a $\pi$-section and FIG. 1(b) a T section.

In the following we shall represent one section of our resonant structure by a lumped parameter circuit in the form of either an $\pi$-section or a T-section as indicated in FIG. 1. We assume that there is no interaction between sections, (see hereinafter).

The transfer matrix A for the section, considered as part of a longer transmission line, satisfies the propagation equation $$\begin{pmatrix} E_n \\ I_n \end{pmatrix} = A \begin{pmatrix} E_{n+1} \\ -I_{n+1} \end{pmatrix} \quad (1)$$

$$\psi_n = A\psi_{n+1} \quad (2)$$

in which $E_n$, $E_{n+1}$ etc. of equation 1 are the output and input voltages and currents respectively, and $\psi_n$ etc. represent the column matrices.

For N identical sections it follows from equation 2 that $$\psi_o = A^N \psi_N. \quad (3)$$

If wave propagation is sustained along the transmission line then we can also write $$\psi_n = \mu \psi_{n+1} \quad (4)$$

where the matrix represents the common losses and phase changes per section. Combining equations 2 and 3 gives the characteristic equation $$A\psi = \mu\psi \quad (5)$$

The eigenvalues of equation 5 represent the sustainable frequency and phase characteristics of the circuit. They may be obtained by diagonalising A. The diagonal values are obtained from the determinant $$\det(A - \mu) = 0 \quad (6)$$

Since we are dealing with a passive network, det A = 1. The eigenvalues of equation 5 are in general complex and since $\mu_1 \mu_2 = 1$, may be written as $$\mu_1 = \tfrac{1}{2} A_0 + [(A_0/2)^2 - 1]^{\tfrac{1}{2}} = e^\gamma \quad (7a)$$

$$\mu_2 = \tfrac{1}{2} A_0 - [(A_0/2)^2 - 1]^{\tfrac{1}{2}} = e^{-\gamma} \quad (7b)$$

where $$A_0 = Tr\, A \quad (8)$$

in which Tr stands for the trace or diagonal sum. We shall see later that $\gamma$ is the transmission line propagation constant. This is in general complex and is given by $$\gamma = \tanh^{-1}[(A_0/2)^2 - 1]^{\tfrac{1}{2}}/(A_0/2)$$
$$= \alpha + i\beta. \quad (9)$$

When $\alpha$ is zero corresponding to a loss-less line we see from equations (7-9) that through the invariance of the trace to the basis functions $\psi_n$ $$Tr\, A = 2 \cos \beta \quad (10)$$

Let the colinearity transformation matrix which diagonalises A be S. Then we may write $$S^{-1} A S = \mu \quad (11)$$

which may be inverted to give $$A = S \mu S^{-1} \quad (12)$$

Circuit Details

Figure 1B:
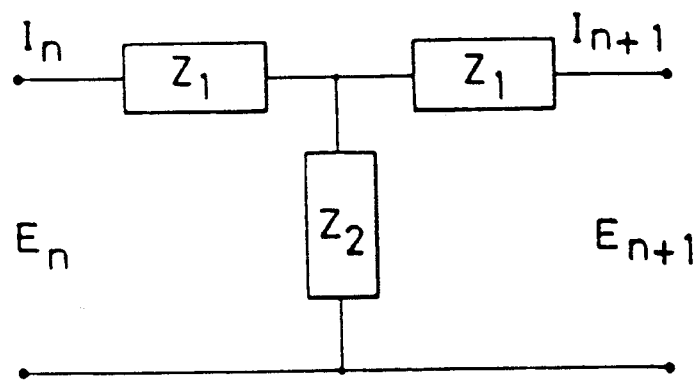

Before proceeding it is necessary to consider the transfer matrix for the particular circuit section. For the $\pi$-section, FIG. 1a $$A = \begin{pmatrix} 1 + (Z_2/Z_1) & Z_2 \\ (2/Z_1) + (Z_2/Z_1^2) & 1 + (Z_2/Z_1) \end{pmatrix} \quad (13)$$

while for the T-section, FIG. 1b we have $$A = \begin{pmatrix} 1 + (Z_1/Z_2) & 2Z_1 + (Z_1^2/Z_2) \\ 1/Z_2 & 1 + (Z_1/Z_2) \end{pmatrix} \quad (14)$$

Provided $A_{11} = A_{22}$, that is to say we have a symmetric section, it is straightforward to show that the characteristic impedance of the section $Z_0$ is given by $$Z_0^2 = A_{12}/A_{21} \quad (15)$$

Using the invariance of Tr A together with equations 7a, 7b and 8, it follows that the transfer matrices, equations 13 and 14 may be written generally as $$A = \begin{pmatrix} \cosh\gamma & Z_0 \sinh\gamma \\ (\sinh\gamma)/Z_0 & \cosh\gamma \end{pmatrix} \quad (16)$$

which may also be generated from the matrix S as follows $$A = S \begin{pmatrix} e^\gamma & \\ & e^{-\gamma} \end{pmatrix} S^{-1} \quad (17)$$

where the matrices S, $S^{-1}$ are given by $$S = \begin{pmatrix} 1 & -Z_0/2 \\ 2/Z_0 & 1/2 \end{pmatrix} \text{ and } S^{-1} = \begin{pmatrix} 1/2 & Z_0/2 \\ -1/Z_0 & 1 \end{pmatrix}. \quad (18)$$

Using S we see that $$S^{-1} A^N S = \begin{pmatrix} e^\gamma & \\ & e^{-\gamma} \end{pmatrix} \quad (19)$$

$$N = \begin{pmatrix} e^{N\gamma} & \\ & e^{-N\gamma} \end{pmatrix}$$

and inverting $$A^N = S \begin{pmatrix} e^{N\gamma} & \\ & e^{-N\gamma} \end{pmatrix} \quad (20)$$

$$S^{-1} = \begin{pmatrix} \cosh N\gamma & Z_0 \sinh N\gamma \\ (1/Z_0)\sinh N\gamma & \cosh N\gamma \end{pmatrix}$$

For a loss-less transmission line comprising N sections corresponding to a wavelength P (P integer), equation 20 shows that the phase relationship along the line satisfies the relationship $$N\beta = 2\pi MP \quad (21)$$

where $\beta$ is the phase shift per section and M (integer) is the resonant mode.

Using this formulation a single turn (P=1) cyclic transmission line has been designed which forms the basis of the petal resonator [Mansfield, P., J. Phys. D., 21, 1643-4 (1988)]. Other related structures are what we have called the chain mail coil and the chain or necklace resonator useful for studying restricted parts of the anatomy, for example, the neck.

In these designs, the current distribution in the successive transmission line elements around a cylindrical surface, follows a cosinusoidal or sinusoidal variation as a function of the cylindrical azimuthal angle $\theta$. For straight wires lieing on the surface of a cylinder parallel to the cylindrical axis, a cosinusoidal current distribution will produce a uniform magnetic field transverse to the cylindrical axis. This will be the case if the straight wires form the impedance elements $Z_1$ of FIG. 1a and the voltage around the line follows a cosinusoidal variation about the drive point. In this case the current flowing through the nth wire, $I_{wn}$ is given as $$I_{wn} = E_n/Z_1. \tag{22}$$

This current follows $E_n$ whereas $I_n$, equations 1, 3 and 16, varies as sin $N\beta$ for a loss-less line.

In NMR imaging applications, a coil structure which produces a uniform transverse magnetic field is useful as a transmitter coil and as a receiver coil. We also note that multi-turn resonator structures are possible with $P>1$.

Input Impedance

It is useful in designing cavity resonators to have an expression for the input impedance of the device. This may be obtained by initially considering the expression for an N element transmission line equation 20 together with equations 1 and 3. Let the input and output voltage and current be $V_1$, $I_1$ and $V_2$, $I_2$ respectively. Then we obtain $$V_1 = V_2 \cosh N\gamma + I_2 Z_0 \sinh N\gamma \tag{23a}$$

and $$I_1 = (V_2/Z_0) \sinh N\gamma + I_2 \cosh N\gamma. \tag{23b}$$

The input impedance is therefore $Z_1 = V_1/I_1$. Let the line be terminated by $Z_2 = V_2/I_2$. Substituting in above we obtain an expression for $Z_1$ for a discrete line which is similar to the well known result for a continuously distributed line, i.e.

$$Z_1 = \frac{Z_0[Z_2 \cosh N\gamma + Z_0 \sinh N\gamma]}{[Z_2 \sinh N\gamma + Z_0 \cosh N\gamma]}. \tag{24}$$

For an open circuit line of wavelength P, $Z_2 = \infty$. In this case $$Z_1 = Z_0/\tanh N\gamma \tag{25a}$$

which for a small argument $N\gamma$ becomes
$$Z_1 \simeq Z_0/N\gamma. \tag{25b}$$

It is worth pointing out that the impedance of an open circuit P$\lambda$ line is not changed if its output is connected to its input. This means that all the resonator designs herein may be either physically cyclic that is actually joined, head to tail, or cut at a high impedance point. The cyclic boundary conditions are identical in both cases. We also point out that the expression $Z_1$ is developed for a $\pi$- or T- section as illustrated in FIG. 1. The actual circuits constructed are symmetrical about the earth point, as discussed with reference to the high frequency probe hereinafter.

Q of Cavity Resonator

The quality factor of the cavity may be found from equation 25 by substituting $\gamma = \alpha + i\beta$ and noting that for a P$\lambda$ line, since $N\beta = 2\pi MP$ on resonance, a small shift $\simeq\omega$ gives $$\tanh N\simeq N\alpha + 2\pi\beta\omega/\omega \tag{26}$$

Using this approximation in equation 25a we note that it produces a Lorentzian variation of $Z_1$ versus $\simeq\omega$ with a line width at half height given when $$2N\alpha = 4\pi\delta\omega/\omega = 2\pi/Q. \tag{27}$$

At resonance the input resistance is $$R = Z_0/N\alpha. \tag{28}$$

Combining equations 27 and 28 we get for the Q factor $$Q = \pi R/Z_0. \tag{29}$$

Simple Resonator Designs

Low Pass

If $Z_1 = 2/j\omega C$ and $Z_2 = (j\omega L + r)$ the transfer matrix this $\pi$-section is given by $$A = \begin{pmatrix} 1 - \omega^2 LC/2 + j\omega rC/2 & j\omega L + r \\ j\omega C/2 & 1 - \omega^2 LC/2 + j\omega rC/2 \end{pmatrix}. \tag{30}$$

From equations 10 and 30 we see that for $r=0$ $$Tr\,A = 2 - (\omega/\omega_0)^2 = 2\cos\beta \tag{31}$$

where $$\omega_0^2 = 1/LC. \tag{32}$$

Figure 2:
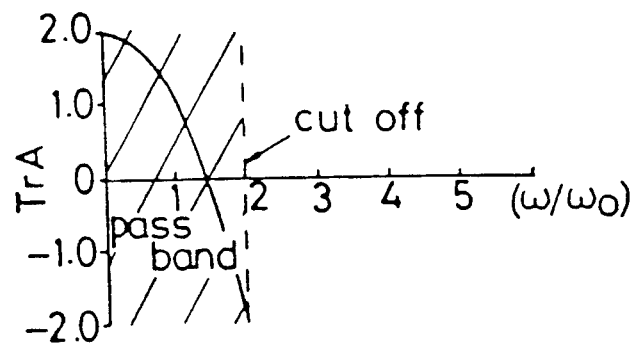
FIG. 2 shows a graph showing the allowed frequency characteristics for a simple low pass filter section.

Plotting this transcendental equation gives for this low pass filter section the allowed frequency response shown shaded in FIG. 2.

Combining equations 21 and 31 we see that the condition for a sustained standing wave in an open circuit line or in a resonant cyclic structure comprising line of fixed length looped back on itself so that input and output terminals are joined, is given by $$(\omega/\omega_0)^2 = 4\sin^2(\pi MP/N) \tag{33}$$

for $1 \leq MP \leq N/2$. Solutions of equation 33 show that the modal frequencies increase from the lowest mode $M=1$ to the cut-off mode $M=N/2P$.

We also find as expected that $$\alpha = r(C/L)^{\frac{1}{2}}/2 = r/2Z_0 \text{ and } \beta = \omega/\omega_0. \tag{34}$$

In this case we obtain the relationship $$R = 2Z_0^2/Nr. \tag{35}$$

From equations 27 and 35 we also obtain the Q value $$Q = 2\pi Z_0/Nr \tag{36}$$

i.e. the Q is determined by the characteristics of a single section resistance.

High Pass Line

In this arrangement $Z_1 = 2(j\omega L + r)$ and $Z_2 = 1/j\omega C$. With these parameters we find for $r = 0$.

$$(\omega hd\, \theta/\omega^2) = 4 \sin^2(\pi MP/N). \tag{37}$$

As in the case for the low pass section $Z_0 = (L/C)^{\frac{1}{2}}$ at high frequencies. Also when loss is included $$\alpha = 4[r/2Z_0]\sin^2(\pi MP/N) \text{ and } \beta = -\omega_0/\omega. \tag{38a}$$

For small $\beta$ this leads to a Q factor of $$Q = NZ_0/2\pi r. \tag{38b}$$

In the "birdcage" resonator design (Hayes et al, 1985), regarded as a series of n-sections $Z_2$ is inductive while $Z_1$ comprises an inductor and a capacitor in series. This has a constructional disadvantage in so far as circuits with many elements require many bulky, high voltage capacitors for individual tuning.

High Frequency Probe

Miniaturising RF probes for high frequency operation can be problematical because dimensions are often limited by the use of lumped element components.

In this work, a new tuneable RF cavity design is introduced, which has application at RF frequencies around 500 MHz or above, but could be scaled and adapted for lower frequencies.

The RF cavity design was inspired by the microwave magnetron cavity resonator. It is similar to the birdcage resonator (Hayes et al, 1985), but has the advantage that it may be accurately constructed from machined solid copper and rods. The theoretical basis of our approach is as presented hereinbefore.

Figure 3:
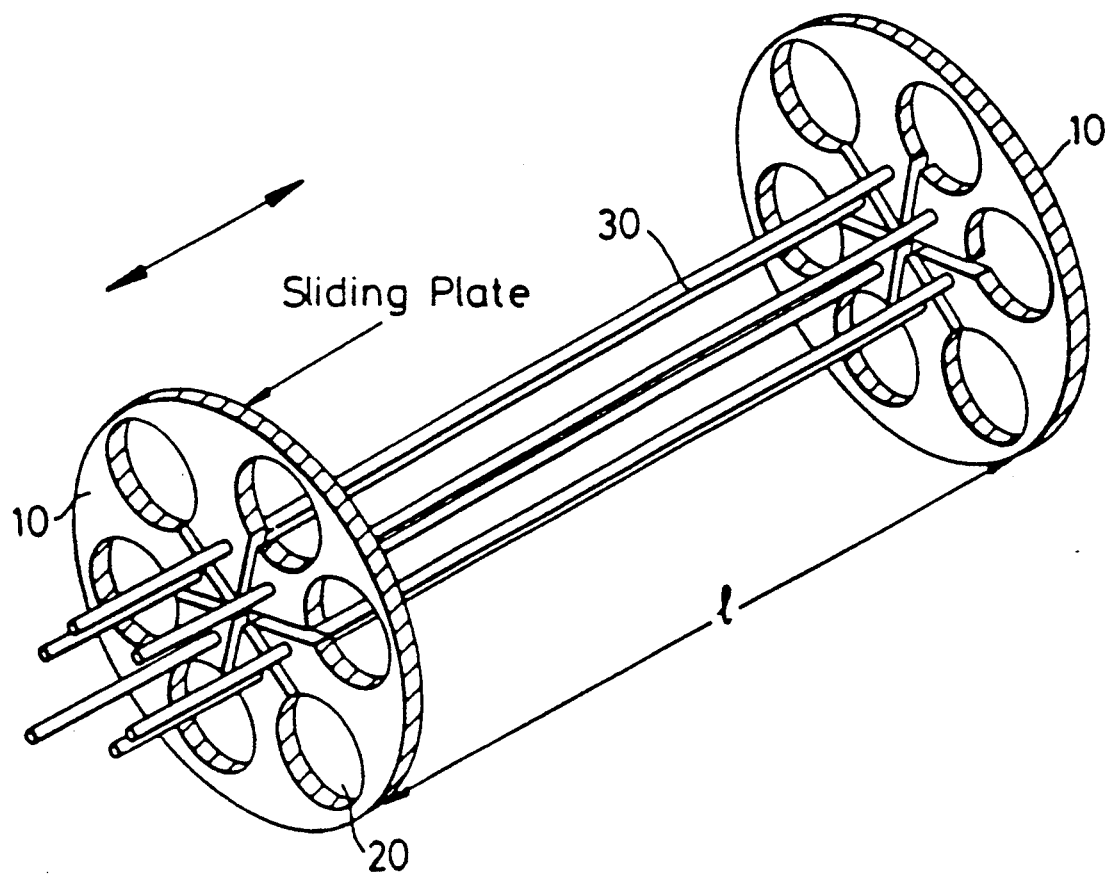
FIG. 3 shows a tuneable NMR cavity comprising a cluster of slotted loop resonators, of effective cavity length 1, according to the present invention.
Figure 4A:
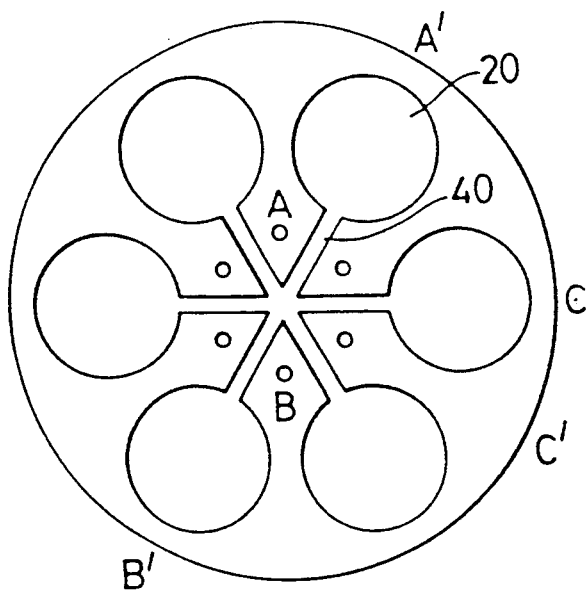
FIG. 4a shows one end plate of the tuneable NMR cavity of FIG. 2.

The resonator consists of two end plates 10, each having a symmetric cluster of slotted loop resonators 20 joined by a number of rod inductors 30, FIG. 3. The plan view of one end plate is shown in FIG. 4a. In a particular embodiment each slotted loop resonator 20 is 10 mm in diameter with an inductance of 11 nH and a gap 40 corresponding to a capacitance of 12 pF giving a resonant frequency of 438 MHz. Leadless chip capacitors may also be used to increase gap capacitance. An alternative end ring arrangement 10' is shown in FIG. 4b. This provides a larger axial access.

In the arrangement of FIG. 4b the end ring comprises an annulus 10' which has loop resonators 20' with slots or gaps 40'. The annulus has an inner surface 41 and an outer surface 42 the circular apertures 20' being formed therebetween. Rods 30' are joined to one end surface 43 at positions intermediate the resonators 20'. A second series of slots 45 is formed in the second end surface 44 towards the first end surface to accommodate a flux guide or sleeve as shown in FIG. 4(d).

To prevent inductive coupling of the slotted loop resonators, a flux guide sleeve or end ring thimble 50 may be fitted over each end ring 10. Such a sleeve arrangement is shown in FIG. 4d. This comprises two short coaxial conducting cylinders 11, 12, the inner cylinder 12 being held centrally within the outer cylinder by a series of conductive metallic spacers or fins 13.

The disposition of the fins 13 is arranged to engage in the slots 14 between the slotted loop resonators of FIG. 4b. The slots 14 must be insulated so that neither the fins 13 nor the flux guide rings 11, 12 touch the resonator 10, FIG. 4b. A suitable insulating material could be an insulating tape or a lacquer. With this or a similar arrangement, magnetic flux from one slotted loop resonator 20' is prevented from coupling with other slotted loop resonators. Provided the annular space between the end rings 11, 12 of the thimble 50 is large enough, a flux return path is provided for each slotted loop resonator 20, thereby maintaining its self-inductance close to the unscreened value.

Figure 5:
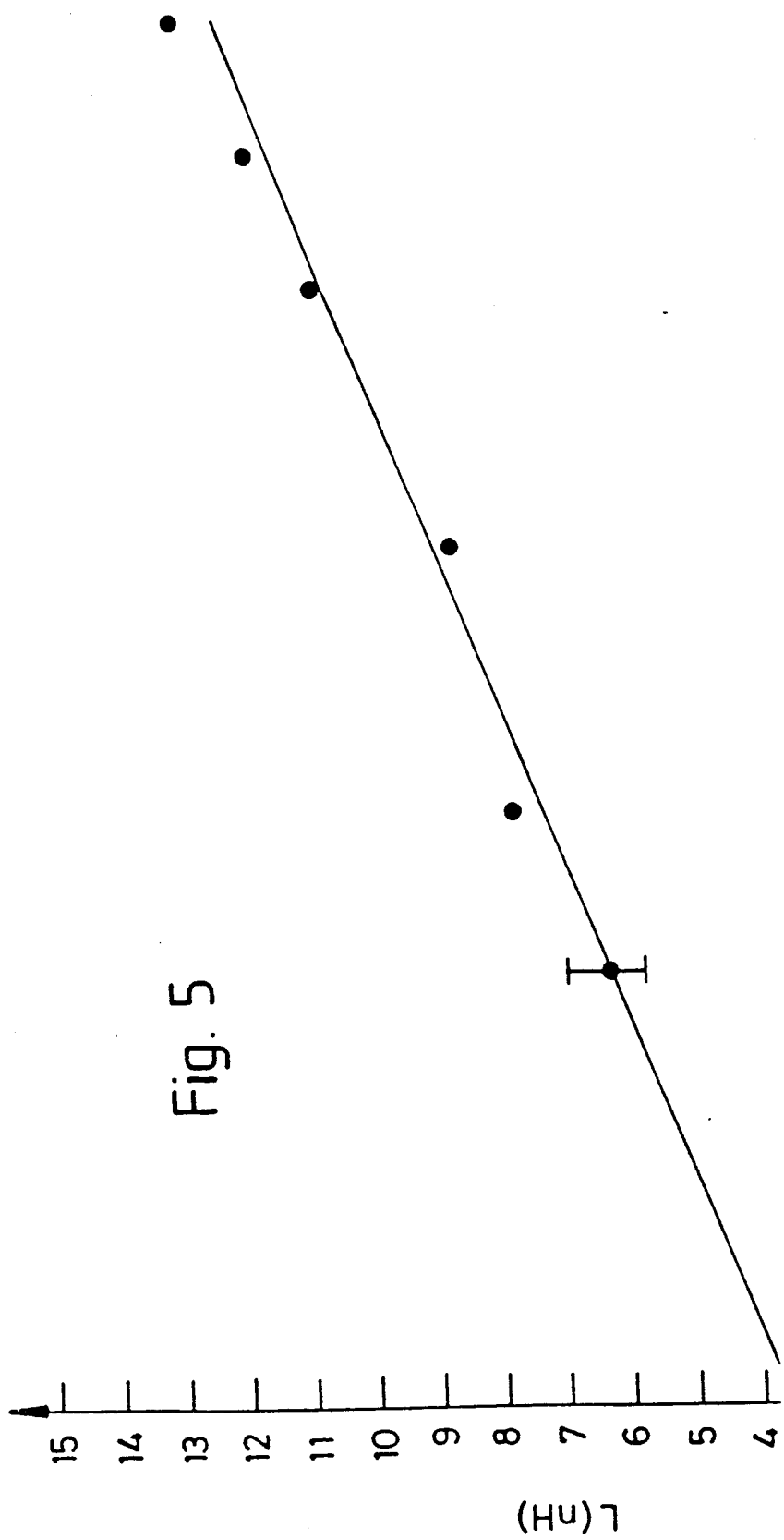
FIG. 5 shows a plot of inductance against diameter for an individual slotted loop resonator.

The characteristics of an individual slotted loop resonator were assessed empirically by measuring the inductance of a single loop, formed by drilling a hole in a copper block. Inductance versus the hole diameter is plotted in FIG. 5. When assembled, the complete coil resonates over a range of frequencies around 500 MHz. Tuning in this design may be done manually by sliding one end plate along the rod inductors. The equivalent circuit for the resonator coil is shown in FIG. 6a with A and B joined.

The allowed frequency response for one section of this circuit ($r_1 = r_2 = 0$) is shown shaded in FIG. 6b. the stop bandwidth frequency is set by the parallel resonant elements, see below.

From the circuit parameters of FIG. 6a and the above analysis with $r_1 = r_2 = 0$ it is found that the resonant angular frequency of the cavity, $\omega$, (when correctly driven) is given by $$\omega^2 = \omega_2^2 \{1 + L_2/4 L_1 \sin^2(\pi M/N)\} \tag{39}$$

For the principal mode, $M = 1$ and for $N = 6$ sections this reduces to $$\omega^2 = \omega_2^2 \{1 + L_2/L_1\} \tag{40a}$$

where $\omega_2^2 = 1/L_2C = 4\pi^2 f_2^2$ and where the rod inductance $L_1 = kl$ in which k is a constant and l is the length of the rods. With these substitutions, Eq. (40a) becomes $$f^2 = f_2^2 \{1 + (L_2/kl)\} \tag{40b}$$

in which f is the cavity frequency. There will in general be mutual inductance between the rods, but this is small and is therefore ignored in this application.

From equations 14 and 15 we find that for $\omega/\omega_2 > 1$, $Z_0 \simeq (L_1/C)^{\frac{1}{2}}$. If we assume that resistive losses in the cavity arise essentially in the rods, a reasonable assumption since the end plates are machined from solid copper, $r_2 = 0$ in which case for $\omega/\omega_2 > 1$ $$\alpha [r_1/2Z_0](\omega_2/\omega)^2. \tag{41a}$$

If however $r_1 = 0$ and the losses arise in the slotted loop resonators, we find that $$\alpha = [r_2/2Z_0](L_1/L_2)\{1 + (L_1/L_2)\}(\omega_2/\omega)^2. \tag{41b}$$

In both cases $\beta = \omega_1/\omega$,

Results

Measurements of resonant frequency for the principal mode (M=1) were taken for different cavity lengths and it was found that the resonant behaviour of the coil was in accordance with theory when driven correctly, thus supporting our initial assumption that mutual inductive effects between sections may be ignored in this case. The coil is driven from one end in balanced mode, as outlined below. With N slotted loop resonators and N rod inductors, N/2 resonant modes are observed.

Circuit Drive

Figure 4C:
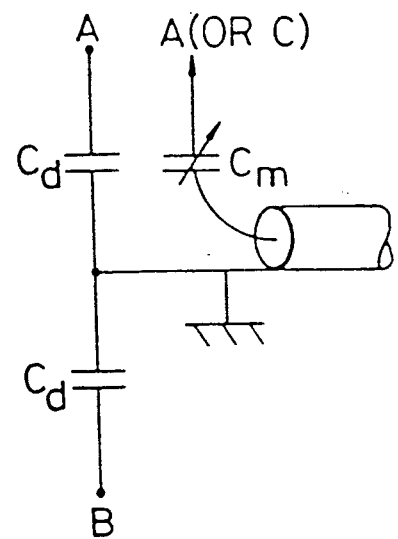
FIG. 4c shows a drive circuit showing quadrature and balanced arrangements.
Figure 4B:
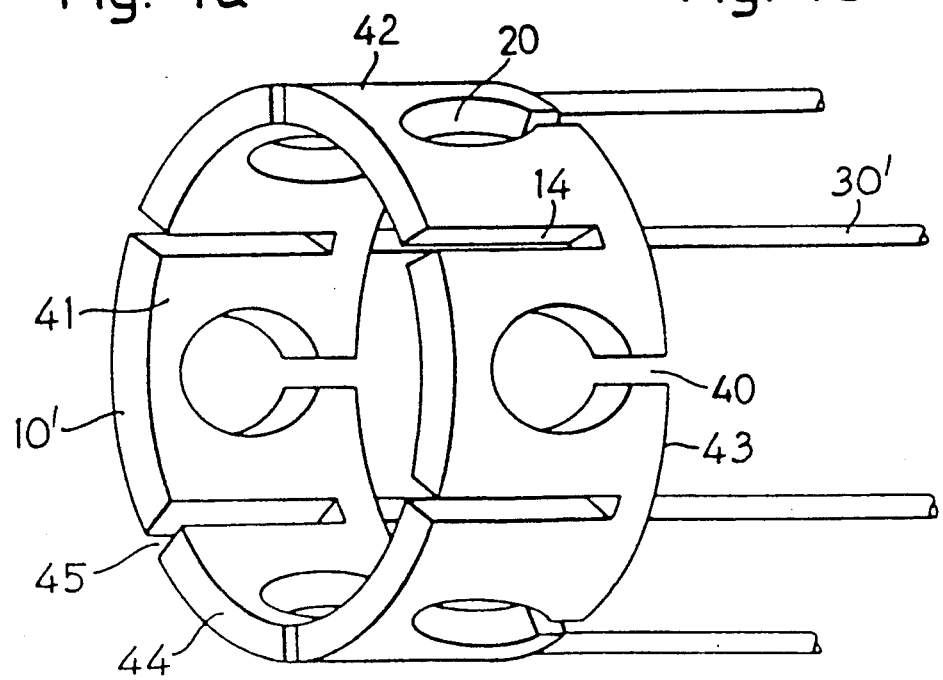
FIG. 4b shows an alternative end plate design with greater axial access.
Figure 4D:
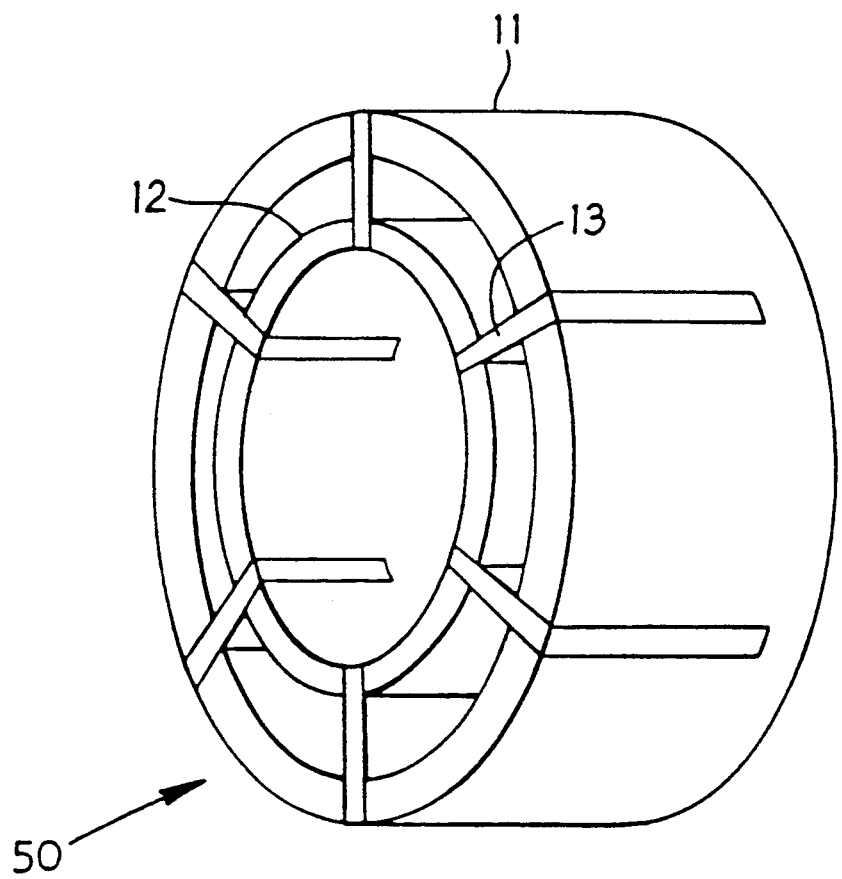
FIG. 4d shows a flux guide sleeve or end ring thimble for use with the alternative end plate design of FIG. 4b.
Figure 7:
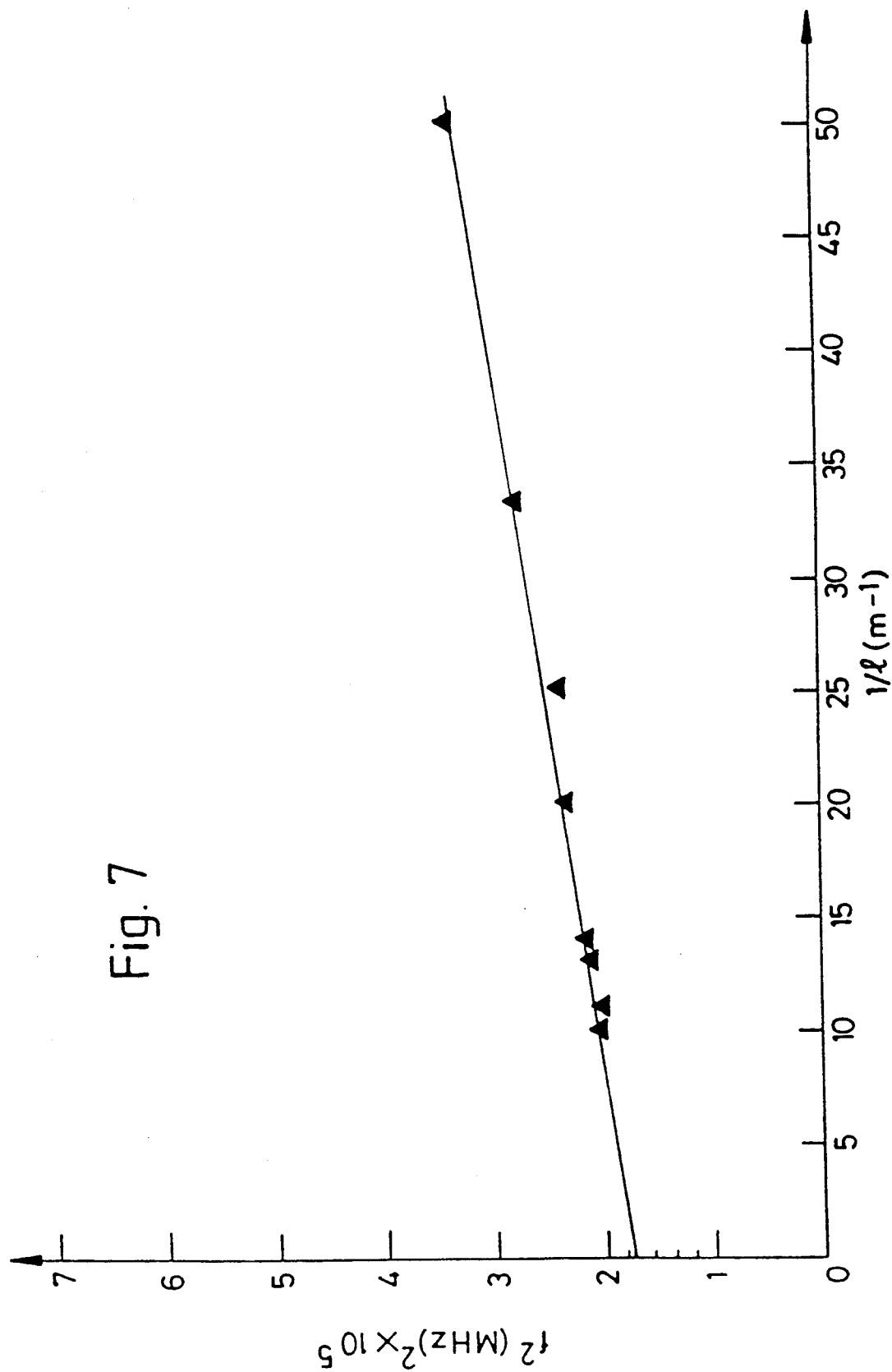
FIG. 7 shows a linear regression plot of $f^2$ against $1/1$ giving asymptotic values of $\omega_o$.

The cavity may be most easily driven from one end plate, FIG. 4a, across AB or A'B' through the split capacitor arrangement, FIG. 4c. The centre point is earthed and the coaxial drive connected to A or alternatively C. (Alternative drive and connection points are indicated with primes). To ensure proper balance, a single capacitor of $\frac{1}{2}C_d$ should be placed across the corresponding points at the other end of the cavity. The square of the cavity frequency, f, is plotted versus 1/1 in FIG. 7 according to the linear regression, equation 40b. the intercept at the origin gives an experimental value for the base frequency $f_2 = 424$ MHz.

Figure 8:
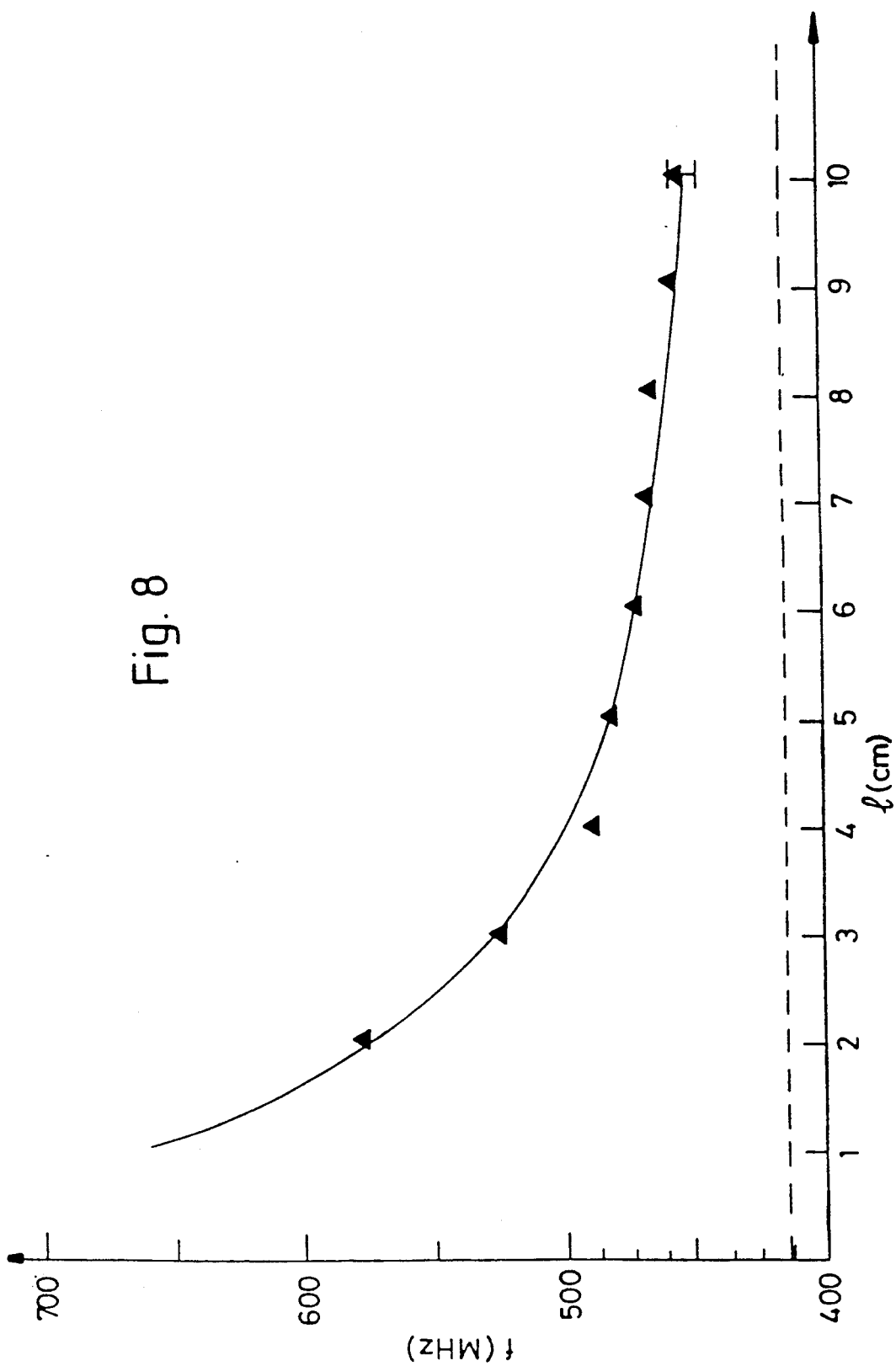
FIG. 8 shows a plot of frequency, f, against length for the quadrature and balanced driving modes of the cavity resonator.

The data are also plotted as f versus 1 in FIG. 8. Using the measured parameters enables the theoretical curve (solid line) to be drawn.

It is also noted that when the input drive is connected to point A, FIG. 4a, it forms an anti-node or high voltage point. Apart from an RF carrier phase shift, the rod currents follow the end plate voltage, see equation 22. The drive point therefore corresponds to a rod current anti-node. Point B has the opposite RF phase. The additional capacitance $C_d/2$ is distributed around all slotted loop resonators to produce an additional slotted loop capacitance of $C_d/2N$. This will therefore affect the base frequency $f_2$ in equation 40b and FIG. 7. This behaviour is confirmed experimentally. This may therefore be used as a fine cavity tuning adjustment. Alternatively, the cavity length 1 may be reduced to restore the desired operating frequency.

At 500 MHz, the Q of the coil was $\sim 160$ and the cavity length was 4.0 cm. From equation 40b we deduce that $L_1 = 7.48$ nH producing a characteristic impedance $Z_0 = 22.3$ Ω. From equation 29 the input resistance $R = 1135$ Ω. The cavity was matched to 50 Ω with a 6.8 pF variable matching capacitor $C_m$ of FIG. 4c with $C_d = 3$ pF. Allowing for $C_d$, the theoretical slotted loop resonance frequency is 429 MHz, in agreement with the measured value from FIG. 7.

We stress that the input impedance $Z_1$ is correct for end plate drive arrangements between points A and C but will be 4 times greater in balanced drive across A and B. For the slotted loop cavity resonator the drive circuit, FIG. 4c, affects $f_2$ in the expected manner by virtue of the additional distributed capacitance, $C_d/2N$, introduced in each slotted loop resonator. To this extent the drive capacitance will change $Z_1$ in a predictable fashion by virtue of its effect on $Z_0$, equation 15.

Alternative Cavity Designs

Figure 9:
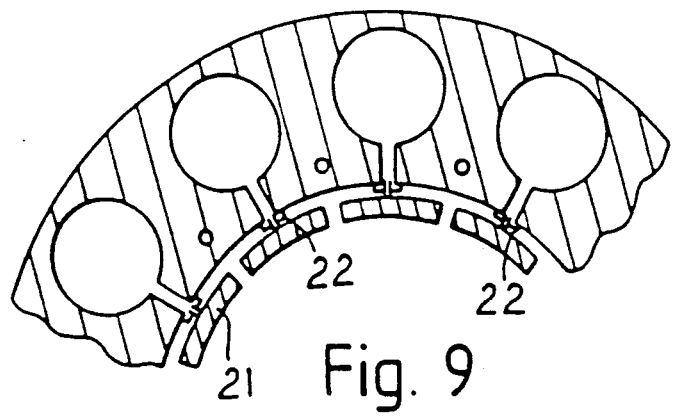
FIG. 9 shows a section of an end plate for a lower frequency resonator design leaving larger central access.

In an alternative low frequency cavity design, a section of the end plate of which is shown in FIG. 9, the slotted loop capacitance is increased by adding a segmented guard ring 21. Alternatively, actual small capacitors 22 may be inserted between the loop slots.

Figure 10A:
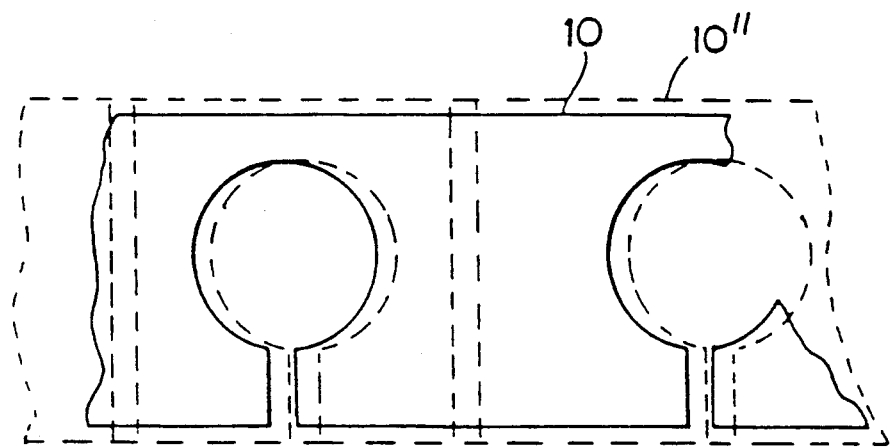
FIG. 10a shows a schematic arrangement in plan view of slotted loop resonators with 2 layers to increase loop inductance.
Figure 10B:
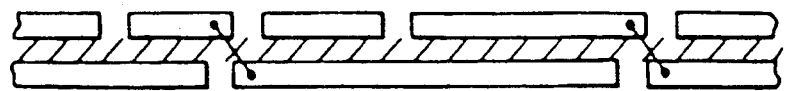
FIG. 10b shows a section in side elevation.

In a further arrangement, the loop inductance may be increased by stacking machined end plates 10, 10' slightly displaced as in the schematic of FIG. 10. In this arrangement, successive layers of inductance must be coupled effectively in series as indicated. In order that successive loop displacements do not block the hole, the second 10' and subsequent layers of loops must be suitably elongated.

Figure 11:
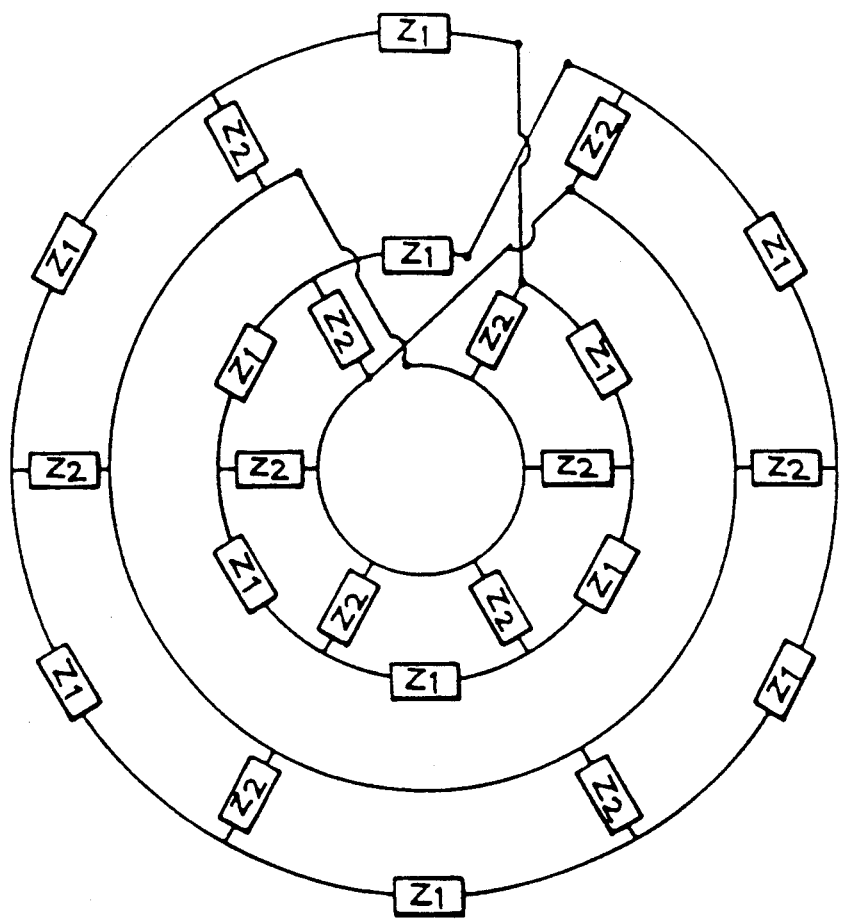
FIG. 11 shows a schematic arrangement for a 2 turn cavity resonator.
Figure 12:
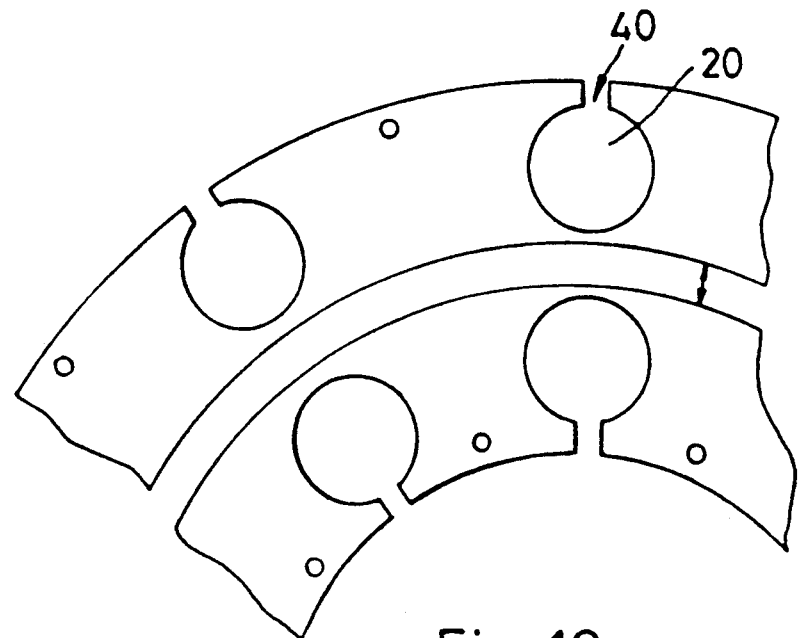
FIG. 12 shows a schematic of a section of an end plate arrangement for a 2 turn cavity resonator.

All the arrangements discussed so far are "single turn" cavities in which a standing wave around the transmission line structure obeys the phase relationship $N\beta = 2\pi MP$ where $\beta$ is the phase shift per section, N the number of sections and M and P are integer. For a λ line the operating frequency, P = 1. The principal mode M = 1 means that there is just $2\pi$ radians of phase shift. However, if P = 2 at the same frequency, then this would imply a two turn structure as sketched in FIG. 11. Such an arrangement would produce double the RF field per unit current at the coil centre and would thus offer a means of effectively increasing the resonator impedance through mutual coupling of the inductive elements. A sketch of part of an end plate arrangement for a two turn cavity resonator is shown in FIG. 12.

Figure 13:
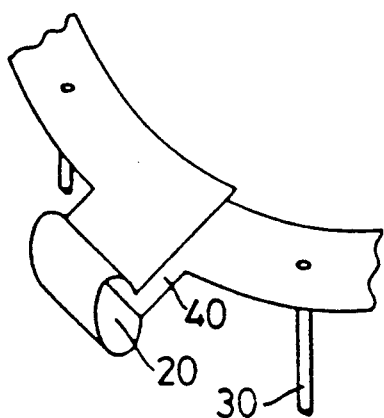
FIG. 13 shows an alternative arrangement in which the loops are rotated out of the plate plane by 90°.

All the inductive loops so far are either flat and in the plane of the end plate or within an end ring arrangement. However in an alternative arrangement of loops they may be rotated out of the plate plane by 90°, FIG. 13. In this arrangement, loop magnetic flux forms a toroidal shape, which is effectively contained in a torus for a large number of elements. The loops must be sufficiently spaced to give effectively no mutual inductance. Alternatively, flux guard plates may be introduced to separate the loops magnetically.

Figure 14:
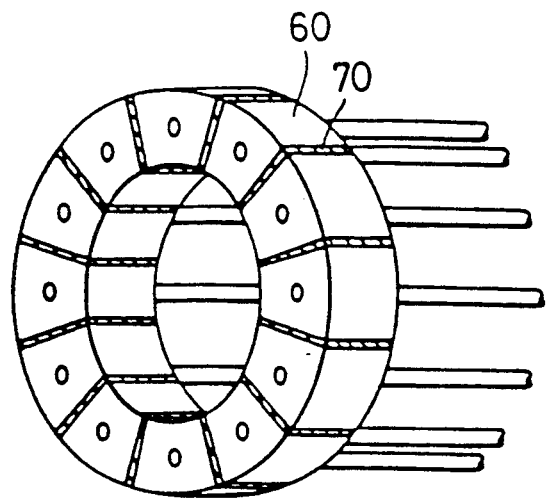
FIG. 14 shows a schematic diagram of one end plate of a high pass resonant cavity coil.

In a further modification of the cavity resonator the equivalent n circuit per section FIG. 1a comprises a capacitor in series with an inductor for $Z_2$ and inductor for $Z_1$. This gives a high pass transmission line section, in this case the cavity end-plates could be made as a segmented ring joined by rod inductors. One end-plate is sketched in FIG. 14. Each segment 60 is machined from solid block and the spaces 70 form a ring of series capacitors. The segments may be suitably spaced with a dielectric material.

Figure 15A:
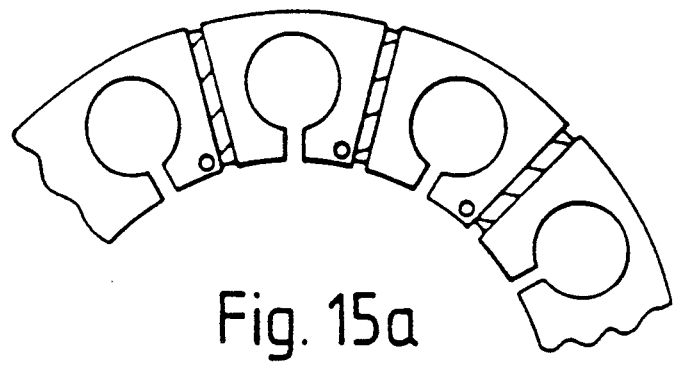
FIG. 15a shows a modification of the cavity resonator of FIG. 14.
Figure 15B:
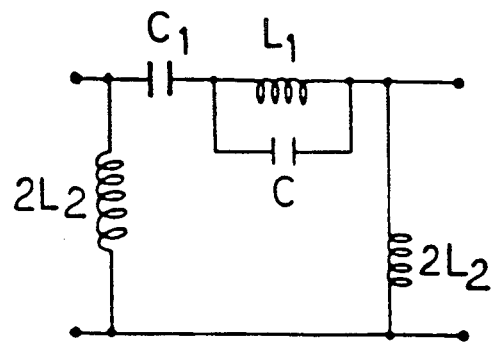

The above arrangement may be further modified as in FIG. 15a. Here the block inductance may be increased by forming a slotted loop. The equivalent circuit for this arrangement is shown in FIG. 15b. When C is small, by having a wide slot (i.e. C = 0), the equivalent circuit reduces to that for FIG. 14.

RF Screening

In some situations it may be desirable to surround the cavity resonator with an RF screening can thereby making the resonator characteristics independent of surrounding metal structures. The effect of the can will be to reduce the rod inductance and also introduce a stray capacitance $C_s$ which shunts each rod. The shunt capacitance may be readily incorporated in the theory. The net effect is to increase the operating frequency f for a given cavity length. The magnitude of the effect depends on the proximity of the screen. For a screen/cavity diameter ratio of 1.25 the frequency change is around 15%. This may be compensated by either increasing the resonator length or by increasing $C_d$ which lowers $f_2$ as outlined in the Circuit Drive description.

Split Resonator Designs

The resonator coil designs described so far are all cagelike arrangements which completely surround the specimen around the cylindrical axis. However, there are a number of situations where it is more convenient to have a split coil system providing easy access for the specimen. Such an arrangement is desirable in the case of very small specimens and also in clinical imaging for easy access of limbs, torso, head etc.

Figure 16:
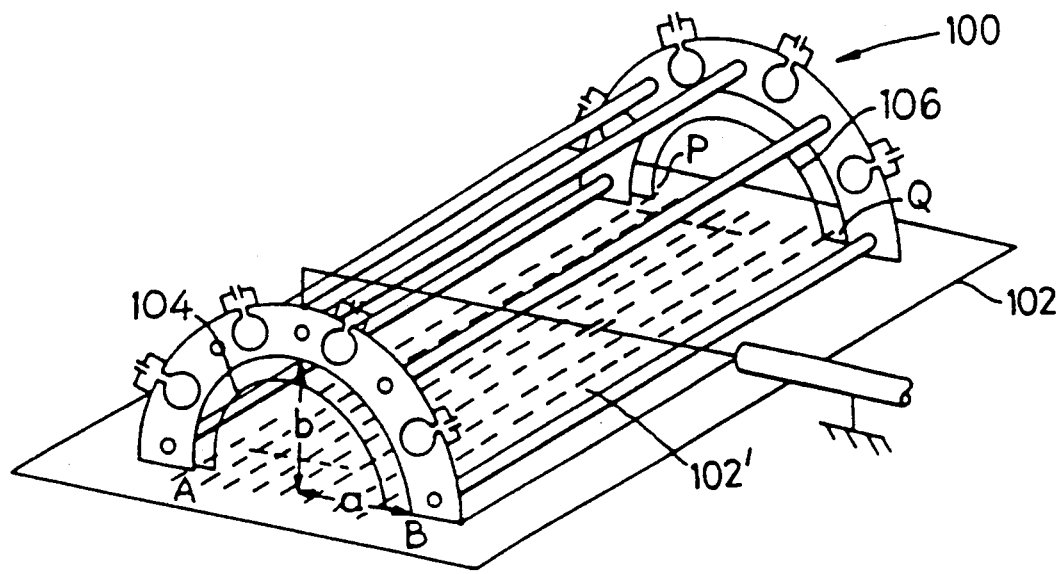
FIG. 16 shows a split or half resonator arrangement with reflective conductive screen according to the present invention.

Such a new split resonator coil arrangement is sketched in FIG. 16. Here, as an example, we take a half cavity array 100 only which is simply placed close to, but not necessarily touching, a large earthed conducting metal sheet 102. Two λ/4 standing waves are generated about the drive point provided all four corners of the half cage are earthed. Because of the particular symmetry of the resonator wires, a magnetic field parallel to the conductor surface will be doubled and rendered uniform due to the induced image currents in the sheet. Magnetically and electrically, the arrangement will behave as though it were a single cylindrical resonator as described earlier, since the boundary conditions for an open circuit λ/2 line are the same as for an open circuit or cyclic line. Practically, however, it is possible to lift the coil in the manner of a cake or cheese dish cover allowing straightforward specimen access. A half-cage coil design without the conducting plate has been described by Ballon, D., Graham, M. C., Devitt, B. L., Koutcher, J. A. Proc., Soc., Mag. Res in Med. 8th Annual meeting, Amsterdam 2,951 (1989), but is less valuable because of poor RF homogeneity and a lower signal response.

The arrangement sketched, FIG. 16 is semicircular in cross-section. But in general it is possible to generate uniform transverse magnetic fields with a semi-elliptical structure in which the elliptical axes are 2a and 2b. Such an arrangement could be extremely convenient as a head coil, or as a leg or knee coil. The corners A,B may be joined by an inner return wire 104 providing current path continuity around the end plate. Corners P and Q should be similarly joined by a wire 106.

Figure 17A:
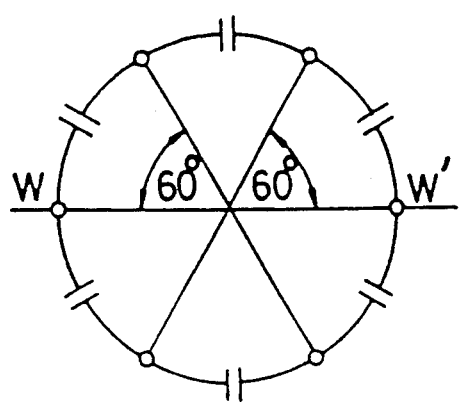
FIG. 17a shows diagrammatically an end view of a wire arrangement for a saddle coil, additional wires W, W' being added for symmetry but carrying no current, i.e. at standing wave nodes.
Figure 17B:
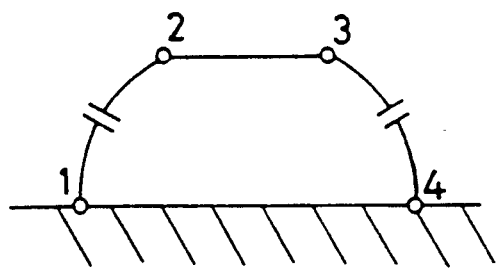
FIG. 17b shows an equivalent split or half saddle arrangement with reflective screen.
Figure 18A:
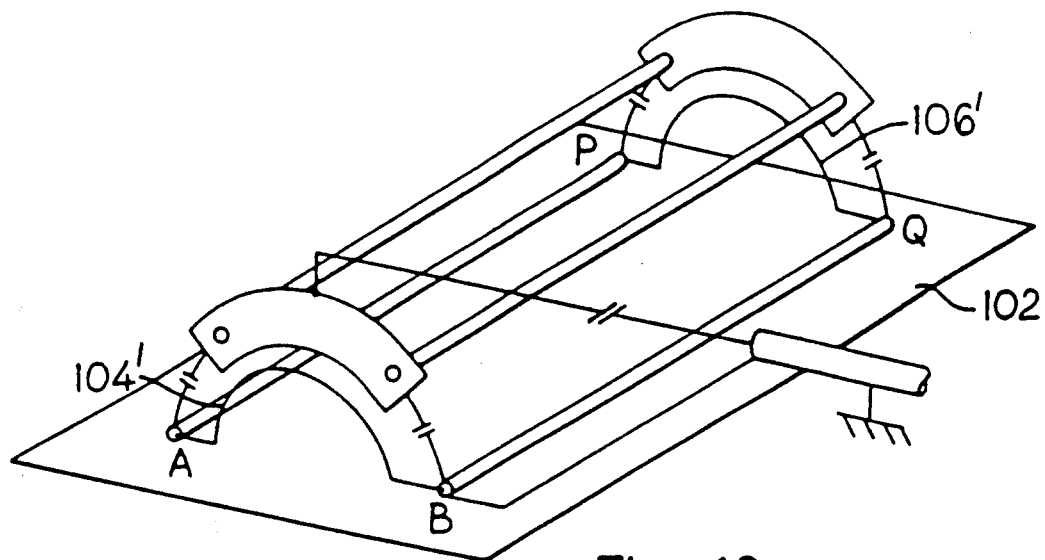
FIG. 18a shows a sketch of a split or half saddle arrangement with screen.
Figure 18B:
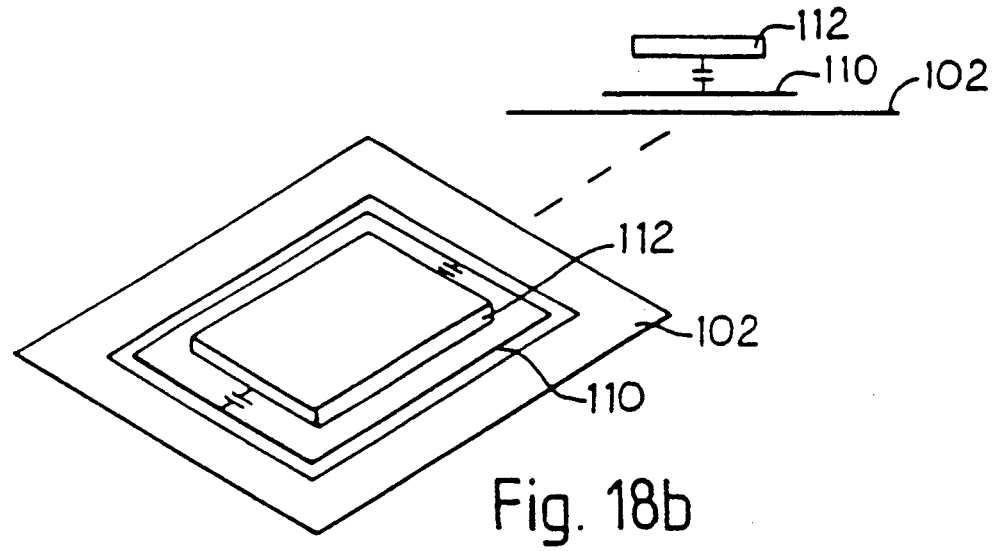
FIG. 18b shows a strip coil with screen.

If the number of wires in a circular cage is reduced to six, the coil structure becomes effectively a saddle coil arrangement, FIG. 17a, where wires $w, w^1$ carry no current, i.e. are at positions corresponding to wave nodes. If a reflective screen is introduced, as in FIG. 17b, wires 1 and 4 form an earth while wires 2 and 3 may be connected since their currents are in phase. The arrangement is sketched in FIG. 18a. To force wires 1 and 4 in the nodal plane, the circuit must be driven as indicated. If the device is not actually touching the screen plate, current return paths may be provided between points A and B and points P and Q in the form of inner return wires 104', 106' as sketched. In a further modification the pair of wires are replaced by a single strip of conductor 110 FIG. 18b and rods 2 and 3 are combined together in a flat conductive sheet 112. In either case, this arrangement offers a demountable coil system useful for flat samples in either microscopy or whole body imaging.

Figure 18C:
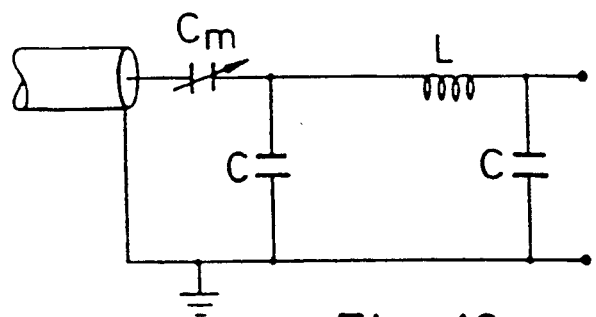
FIG. 18c shows an equivalent circuit of a split saddle or strip coil with drive.

The presence of the conducting plate serves to symmetrize the arrangement, thereby increasing the field and at the same time making it more uniform. The equivalent circuit and drive arrangement are shown in FIG. 18c.

The alternative end plate design of FIG. 4b may be halved across its diameter to produce a split or half resonator design replacing the two half end plates shown in FIG. 16. To obviate mutual inductance between loops, the end ring thimble FIG. 4d may also be halved to fit the half resonator end rings.

In the embodiment of FIGS. 16 and 18 the conductive sheet 102 is preferably not a continuous sheet but may comprise a plurality of strips as indicated by dotted lines 102' in FIG. 16. This is in order to satisfy the boundary conditions for RF currents but to block other induced currents at lower frequencies which would otherwise be caused by the switched gradients used in NMR.

The strips may be formed by commencing with a continuous sheet and slitting it at appropriate distances. Alternative arrangements comprise cutting the sheet into suitably shaped flat loops which follow the induced RF current contours in an otherwise continuous conductive sheet.

In a further modification, the passive conductive sheet is replaced by an actively driven flat wire array provided with current to simulate the induced screening currents in a flat passive conductive sheet.

Using the matrix approach we have designed a cavity resonator type NMR coil operating at 500 MHz. The analysis developed ignores mutual inductive effects between transmission line sections. Experimental results obtained with the resonator coil confirm the theoretical expectations for the fundamental mode. The general frequency characteristics of the higher resonant modes are also reasonably well described by the theory, although there are differences between the observed relative frequencies and those predicted by the theory. These could well be ascribable to the ignored mutual inductive effects. However, in NMR applications we are generally only interested in the fundamental mode since the higher order modes in these resonant structures produce spatially inhomogeneous RF fields. A symmetrical balanced drive arrangement is found to give best performance of the circuit when applied from one end of the cavity resonator.

The idea of a split resonator design is introduced in which half a resonator array is placed close to but not touching a flat conducting plate. Since the split coil cross-section may be semi-circular or semi-elliptical and is not fixed to the plate, the whole assembly is demountable thereby allowing easy access for limbs, head or whole body imaging.

A variant of the split coil design is also described which corresponds to a half saddle arrangement. This may be further modified to produce a strip coil in proximity to an isolated conducting plate.

I claim:

1. A resonant array for NMR use at high frequencies, said array comprising:
   two similar end structures shaped and dimensioned to define high frequency electrically resonant cavities;
   a plurality of electrically conductive rods connected between said end structures and supporting said end structures at a predetermined distance apart to form an array including said end structures and said electrically conductive rods;
   the end structures being shaped and dimensioned and the connecting rods being positioned in a way that is effective to cause the array to define a plurality of electrical circuit sections selected from the π and T classes of electrical circuits and is effective to support a standing wave.

2. A resonant array for NMR as claimed in claim 1 in which each end structure comprises a machined plate.

3. A resonant array as claimed in claim 2 in which each end plate comprises a substantially circular disc having circular apertures equidistantly spaced on the surface of the disc, in which each aperture has connected thereto one end of an elongate channel extending into a common central region of the plate in which the other end of each elongate channel is connected to form a central aperture, and in which each one of the plurality of continuous rods is connected to the plate at a position intermediate between each elongate channel to form the array.

4. A resonant array as claimed in claim 2 in which the rods are joined to one end plate by means of a plurality of through holes in the end plate, each rod being slidable within its respective hole in the end plate to thereby allow adjustment of the distance apart of the end plates.

5. A resonant array as claimed in claim 2 in which each end plate comprises a main annulus having an inner and an outer cylindrical surface defined by the thickness of the main annulus and a first and second end surface defined by the width of the annulus, the main annulus being provided with a plurality of circular apertures equidistantly spaced around its surface providing circular holes through the main annulus from the inner to the outer surface, the main annulus being also provided with a plurality of first slots joining each circular aperture to the first end surface and a plurality of second slots formed in the main annulus from the second end surface towards the first end surface so as to partially separate the circular apertures and a respective rod of the plurality of rods being joined to the main annulus at a first end surface at a respective position between the first slots, the rods being equispaced around the annulus.

6. A resonant array as claimed in claim 5 including a flux guide sleeve, the flux guide sleeve comprising an inner annulus and an outer annulus the inner annulus being of smaller diameter than the annulus and the outer annulus being of larger diameter than the annulus, in which the inner and outer annuli are connected together by a series of fins, in which the fins and the inner and outer annuli are electrically conductive, and in which the finds are spaced at intervals around the annuli to co-operate with the second slots to enable the flux guide sleeve to be fitted over each annulus.

7. A resonant array in which the array comprises a first and second array as claimed in claim 3 the first array being larger than the second array, the second array being positioned inside the first array.

8. A resonant array as claimed in claim 1 in which each end plate comprises an annulus, the annulus being constructed with a plurality of electrically conductive segments, each segment being separated from its next adjoining segments by an electrical insulator to thereby electrically isolate each segment, and in which a respective rod is joined to each segment to thereby equispace the rods around the annulus.

9. A resonant array as claimed in claim 2 in which each end plate comprises a half annulus, each half annulus being provided with a plurality of circular apertures therethrough and a plurality of elongate channels connecting each circular aperture to an outside surface of the half annulus, each respective rod being joined to the half annulus at a position between adjacent circular apertures, the rods thereby joining the two half annuli to form a cheese dish arrangement, and including an electrically conductive plate the cheese dish arrangement being placed on but not touching the conductive plate.

10. A resonant array as claimed in claim 2 in which each end structure comprises a half annulus, the rods thereby joining each half annulus to form a cheese dish arrangement, and including an electrically conductive plate the cheese dish arrangement being placed on but not touching the conductive plate.

11. A resonant array as claimed in claim 2 in which each end structure comprises a partial structure each partial annulus supporting first and second rods, in which third and fourth rods are placed on either side of the partial structure in positions near to but not electrically touching a flat conductive sheet, in which the first and third and second and fourth rods are electrically connected via respective capacitors at each end of the rods.

12. A modification of the resonant array as claimed in claim 11 in which the first and second rods are combined in a flat rectangular conductive inner sheet, in which the third and fourth rods are combined in an electrically conductive wire surrounding the sheet in the same plane as the sheet but not touching the sheet and in which the flat conductive plate in shaped to surround the wire on the same plane as the wire but not to electrically contact the wire.

* * * * *